United States Patent
Busch et al.

(10) Patent No.: US 11,081,336 B2
(45) Date of Patent: Aug. 3, 2021

(54) METHOD OF MAKING GRAPHENE AND GRAPHENE DEVICES

(71) Applicant: VAON, LLC, Bowling Green, KY (US)

(72) Inventors: Jim Busch, Columbus, OH (US); Lindsey Lindamood, Columbus, OH (US)

(73) Assignee: VAON, LLC, Bowling Green, KY (US)

( * ) Notice: Subject to any disclaimer, the term of this patent is extended or adjusted under 35 U.S.C. 154(b) by 0 days.

(21) Appl. No.: 16/988,475

(22) Filed: Aug. 7, 2020

(65) Prior Publication Data

US 2020/0373155 A1   Nov. 26, 2020

Related U.S. Application Data

(62) Division of application No. 15/825,209, filed on Nov. 29, 2017, now Pat. No. 10,777,406.

(60) Provisional application No. 62/427,252, filed on Nov. 29, 2016.

(51) Int. Cl.
| | | |
|---|---|---|
| *H01L 21/02* | (2006.01) | |
| *C01B 32/186* | (2017.01) | |
| *H01L 21/28* | (2006.01) | |
| *C01B 32/184* | (2017.01) | |
| *H01L 29/16* | (2006.01) | |
| *G01J 3/44* | (2006.01) | |

(52) U.S. Cl.
CPC ...... *H01L 21/02115* (2013.01); *C01B 32/184* (2017.08); *C01B 32/186* (2017.08); *H01L 21/02488* (2013.01); *H01L 21/02491* (2013.01); *H01L 21/02502* (2013.01); *H01L 21/02513* (2013.01); *H01L 21/02527* (2013.01); *H01L 21/02672* (2013.01); *H01L 21/28247* (2013.01); *C01B 2204/22* (2013.01); *G01J 3/44* (2013.01); *H01L 29/1606* (2013.01)

(58) Field of Classification Search
CPC ..................................................... H01L 21/02
See application file for complete search history.

(56) References Cited

FOREIGN PATENT DOCUMENTS

JP   2013256408 A   12/2013

OTHER PUBLICATIONS

Dahal, A., et al., Graphene-nickel interfaces: a review, nanoscale 2014, 6, 2548-2562.

*Primary Examiner* — Marvin Payen
(74) *Attorney, Agent, or Firm* — 21st Century IP LLC; Kelly Hollowell

(57) ABSTRACT

The present invention generally relates to a method of making graphene and graphene devices.

12 Claims, 9 Drawing Sheets

Raman Shift (1/cm)

METHOD OF MAKING GRAPHENE AND GRAPHENE DEVICES

CROSS REFERENCE TO RELATED APPLICATIONS

This Application is a Divisional of U.S. application Ser. No. 15/825,209 filed Nov. 29, 2017, which claims priority to U.S. Provisional Application No. 62/427,252 filed Nov. 29, 2016, all of which are incorporated herein in their entirety by reference.

FIELD OF THE INVENTION

The present invention generally relates to a method of making graphene and graphene devices.

BACKGROUND OF THE INVENTION

Graphene is a substance composed of pure carbon, with atoms arranged in a regular hexagonal pattern similar to graphite, but in a one-atom thick sheet. It is very light, with a 1-square-meter sheet weighing only 0.77 milligrams. The structure of graphene is a single planar sheet of $sp^2$-hybrid bonded carbon atoms that are densely packed in a honeycomb crystal lattice. Graphene is most easily visualized as an atomic-scale chicken wire made of carbon atoms and their bonds. The graphene atoms are arranged into a two-dimensional honeycomb structure with the crystalline or "flake" form of graphite consisting of many graphene sheets stacked together.

Graphene is about 100 times stronger than steel; conducts electricity better than copper; and is more flexible than rubber. It is touted as possible replacement for silicon in electronics.

Only identified in 2004, graphene is a single layer of tightly packed carbon atoms making it the thinnest material ever created and offering huge promise for a host of applications from information technology to energy to medicine. Graphene can be made by several methods such as scotch-tape or chemical ex-foliation, chemical vapor deposition (CVD) induced growth, graphite oxide reduction. The two primary methods of production are chemical exfoliation and graphite oxide reduction. These methods unfortunately only produce small flakes of graphene (usually dispersed in a liquid medium). They also require use of aggressive solvents to break graphene oxide apart from the carbon source (such as graphite) and remove oxygen from graphene oxide to form graphene. Epitaxial Growth on a substrate produces larger graphene sheets (currently able to make up to 40" square; and works by exposing $CH_4$ and $H_2$ to a substrate (such as copper foil) inside a high temperature furnace. This method requires etching of substrate to remove and transfer the graphene sheet. It is overall, a very costly and time consuming method to produce a large sheet of graphene.

In view of the above, it would be useful to be able to make graphene in a simpler, less costly way. It would also be useful to be able to make graphene directly on a device, thereby eliminating the need for transferring the graphene.

SUMMARY OF THE INVENTION

In an aspect, the present invention provides a novel graphene device precursor.

In another aspect, the present invention provides a novel method of making graphene.

In another aspect, the present invention provides a novel graphene device.

These and other aspects, which will become apparent during the following detailed description, have been achieved by the inventors' discovery of a new method of making graphene.

DETAILED DESCRIPTION OF THE INVENTION

Figure 1:
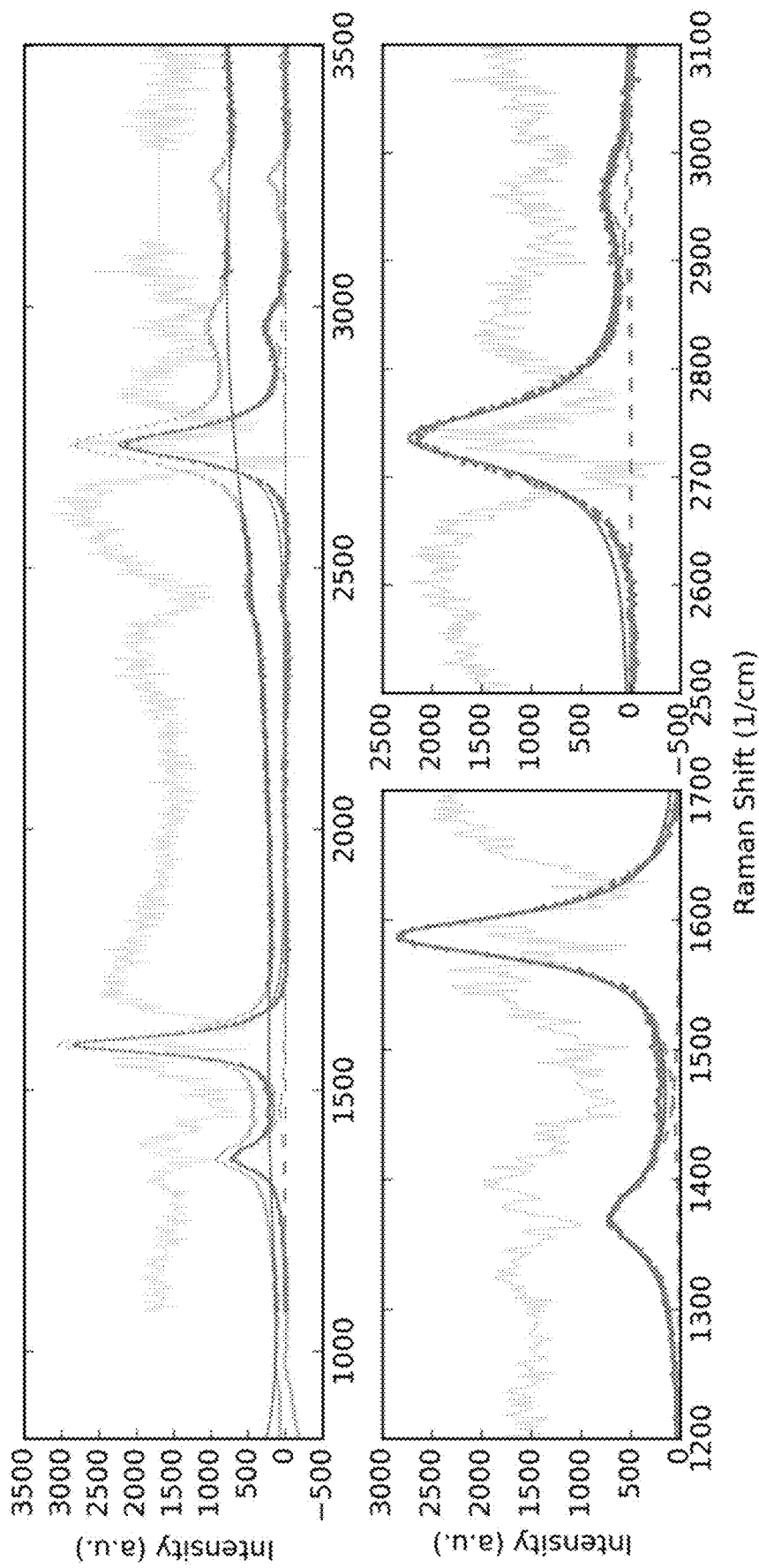
FIG. 1 shows the Raman spectra from a device that had been heated to 800° C. The spectra were taken at a point 3 μm from a Ni edge. These spectra (and the remainder described herein) are of the material that is located on the insulator layer.
Figure 2:
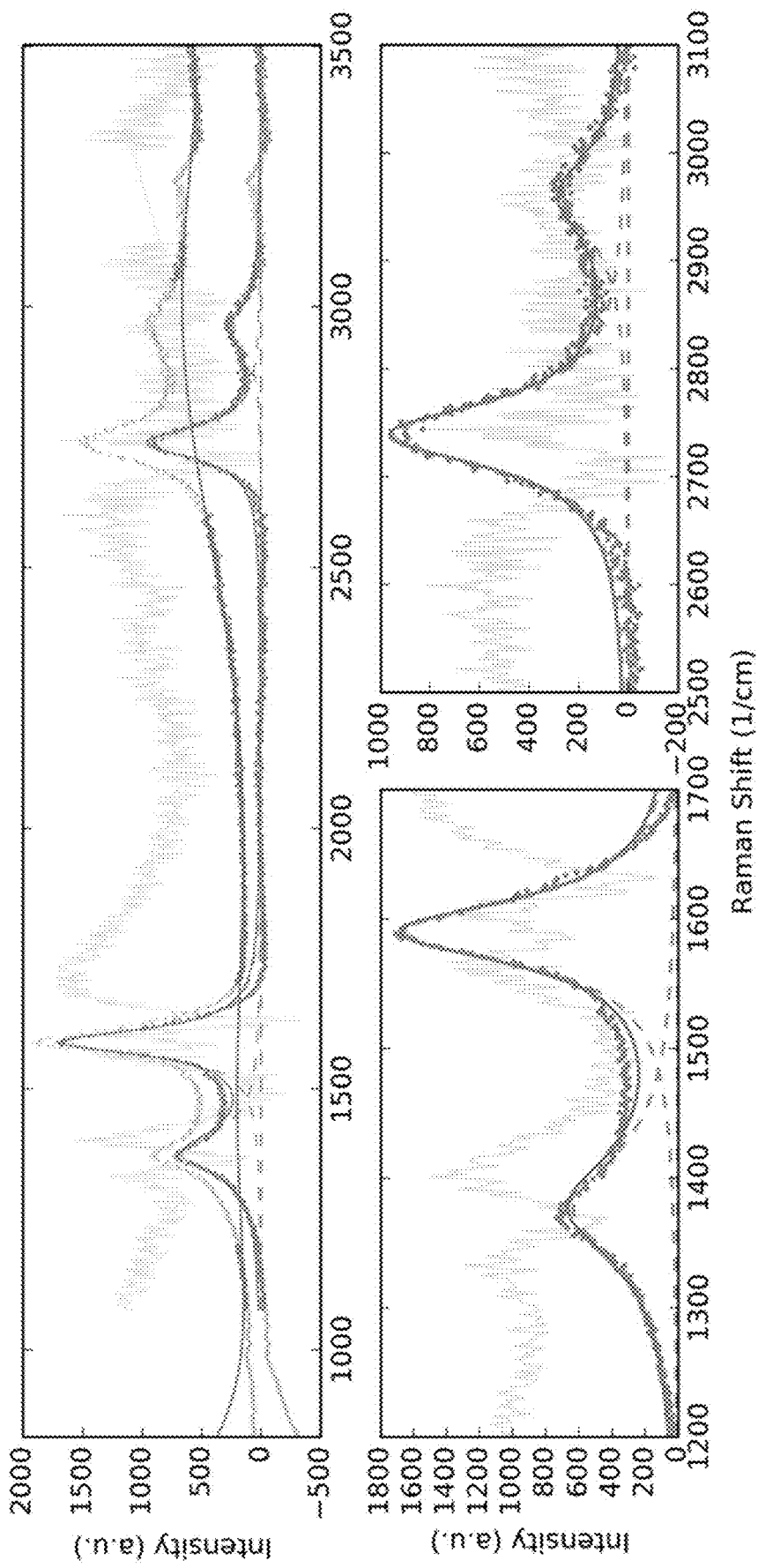
FIG. 2 shows the Raman spectra from a device that had been heated to 800° C. The spectra were taken 50 μm from a Ni edge.
Figure 3:
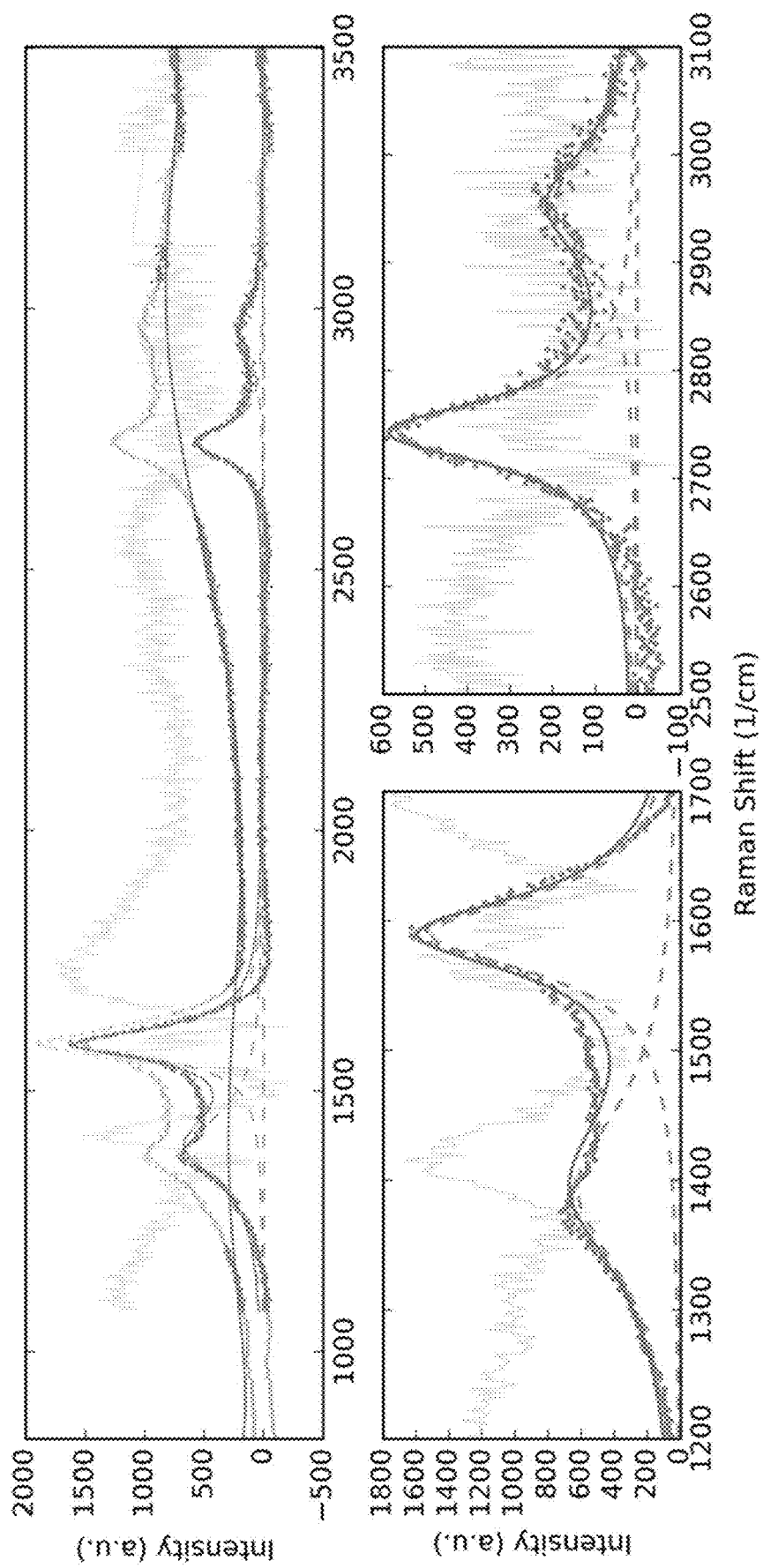
FIG. 3 shows the Raman spectra from a device that had been heated to 800° C. The spectra were taken 100 μm from a Ni edge.

In an aspect, the present invention provides a novel graphene device precursor, comprising:
- an insulator layer, wherein at least the top portion of the insulator layer is an electrical insulator;
- a metal layer in contact with and covering part of the top of the insulator layer;
- a carbon layer in contact with the metal layer and the top of the insulator layer;
- an optional passivation layer located between the insulator layer and the metal/carbon layers and in contact with and covering a substantial portion of the top of the insulator layer; and,
- an optional metal adhesive layer located between the metal layer and either the insulator layer or passivation layer, if present.

In another aspect, the insulator layer is a thermal oxide (thermal silicon oxide) layer (e.g., $SiO_2/Si$). For the thermal oxide wafer, at least the top portion of the wafer is $SiO_2$ (i.e., insulating). Typically, the top and bottom portions of thermal oxide wafers are $SiO_2$. Additional examples of insulators include crystalline quartz, sapphire, HBN, PBN, MgO, YSZ, and SiC. The thickness of the insulator layer (e.g., a 285 nm $SiO_2/Si$ wafer) can vary depending upon the characteristics desired for the graphene device.

The metal layer covers only a part of the top of the insulator layer (and passivation layer, if present). In another aspect, the metal facilitates growth of graphene on the insulator layer (and passivation layer, if present). Examples of the types of metals that are useful are those having high carbon solubility (e.g., >1.5 atom %@1000° C.) and/or those having a crystal structure that acts as a graphene template. The metal layer can be one continuous piece (e.g., 2, 3, 4, 5 or more fingers connected by a perpendicular strip), multiple non-touching sections (e.g., 2, 3, 4, 5 or more non-connected strips or a plurality of dots or islands of metal), or even a combination (e.g., connected fingers and small non-connected dots or islands of metal located between the fingers). As an example, the metal can be present in a pattern that is useful to make an electronic device (e.g., an interdigital electrode (IDE) pattern). In another aspect, a sufficient amount of metal layer is present such that the graphene grown, in accordance with the method described herein, connects the different portions of metal (e.g., fingers, strips, dots, etc.).

In another aspect, the metal layer is Ni. Other examples of metals include Co, Re, Pd, and Pt. The thickness of the metal layer can vary depending upon the characteristics desired for the graphene device. Examples include from about 10, 20, 30, 40, 50, 60, 70, 80, 90, 100, 110, 120, 130, 140, 150, 160, 170, 180, 190, to 200 nm.

It is not uncommon for metals such as Ni, Co, Re, Pd, and Pt to weakly adhere to an insulator layer (e.g., thermal oxide). Thus, in another aspect, a metal adhesion layer is present between the metal layer and the insulator layer (or between the metal and passivation layers, if the passivation layer is present). Examples of metal adhesion layers include Ti and Cr. Examples of the thickness of the optional adhesive layer include from about 1, 2, 3, 4, 5, 6, 7, 8, 9, to 10 nm. The metal adhesive layer is present in the same pattern as the metal layer (e.g., an IDE pattern).

The carbon layer is in contact with the metal layer and the top of the insulator layer (or passivation layer if present). Examples of the thickness of the carbon layer include from about 0.3, 0.4, 0.5, 0.6, 0.7, 0.8, 0.9, 1, 2, 3, 4, 5, 6, 7, 8, 9, 10, 15, 20, 25, 30, 35, 40, 45, to 50 nm (or more if desired). In another aspect, the carbon layer is amorphous.

In the method described herein, heat is used to form graphene. However, some of the insulator layers described herein (e.g., thermal oxide) are not very stable at the upper temperature ranges used. One way to protect thermally unstable layers is to coat them with a passivation layer. Thus, in another aspect, a passivation layer is present. The passivation layer is located between the insulator layer and the metal/carbon layers and is in contact with and covering a substantial portion of the top of the insulator layer. The passivation layer is designed to cover a substantial portion of the insulator layer and thereby protect it. Examples of the thickness of the passivation layer include from about 1, 2, 3, 4, 5, 6, 7, 8, 9, 10, 15, to 20 nm (or more if desired). The passivation layer is typically an oxide, such as $Al_2O_3$, $HfO_2$, $Ta_2O_5$, ZnO, $TiO_2$, and $SiO_2$.

Alternatively, the passivation layer is present, but only in the same pattern as the metal layer (and optional metal adhesive layer). In this aspect, the passivation layer is designed to protect the insulator layer from the metal layer during heating of the precursor.

In another aspect, the present invention provides a novel method of growing graphene, comprising:
(a) heating a graphene device precursor to a temperature sufficient to initiate graphene formation; and,
(b) cooling the graphene device precursor.

Graphene refers to a layer of material, primarily comprising graphene (a crystalline allotrope of carbon typically of a single atomic plane of graphite having a 2-dimensional hexagonal lattice structure of carbon atoms). The layer formed by the present invention is typically from 1, 2, 3, 4, 5, 6, 7, 8, 9, to 10 atomic layers in thickness.

In another aspect, the heating is conducted in a closed furnace. Other examples of heat sources include a substrate heater, microwave heater, RF heater, and UV heater.

In another aspect, the heating is conducted in a substantially oxygen-free atmosphere.

In another aspect, the heating is conducted in the presence of a substantially oxygen-free gas. An example of a gas is a hydrogen-containing gas (e.g., forming gas). Examples of gases include 95% Ar/5% $H_2$ and 95% N/5% $H_2$.

In another aspect, the precursor is heated to a temperature of about 400° C. Other examples of the temperature include from about 450, 500, 550, 600, 650, 700, 750, 800, 850, 900, 950, to 1000° C.

In another aspect, the temperature is maintained for about 1 minute. Other examples of the time the temperature is maintained include from about 2, 3, 4, 5, 10, 15, 20, 25, 30, 35, 40, 45, 50, to 55 minutes and from about 1, 1.5, 2, 2.5, 3, 3.5, 4, 4.5, to 5 hours.

In another aspect, the heating is conducted in the present of an 02 scavenger. Examples of $O_2$ scavengers include Ti chips and a hydrogen-containing gas.

In another aspect, the heating is conducted in a vacuum. Examples of the pressure at which the heating is conducted include from about 500, 450, 300, 250, 200, 150, 100, 50, 25, 20, 10, 5, to 1 mT (mTorr or millitorr).

In another aspect, the cooling is conducted naturally. Natural cooling refers to turning off the power to the heat source (or removing the heat source) and letting the heat dissipate without further assistance.

In another aspect, the cooling is accelerated. As an example, accelerated cooling can be achieved by exposing the device to ambient atmosphere.

In another aspect, the present invention provides a novel graphene device, comprising:
an insulator layer, wherein at least the top portion of the insulator layer is an electrical insulator;
a metal layer in contact with and covering part of the top of the insulator layer;
a graphene layer in contact with the metal layer and the top of the insulator layer;
an optional passivation layer located between the insulator layer and the metal/carbon layers and in contact with and covering a substantial portion of the top of the insulator layer;
an optional metal adhesive layer located between the metal layer and either the insulator layer or passivation layer, if present.

EXAMPLES

The following examples are meant to illustrate, not limit, the present invention.

Example 1

A small sample of a 285 nm $SiO_2$/Si wafer is cleaved via a diamond scroll to be used as the insulating layer.

The oxide surface ($SiO_2$) is then cleaned with acetone and methanol. The surface is further cleaned by reactive ion etching the surface in $O_2$ prior to metallization to remove any remaining organic substances.

An electron beam evaporation system (E-Beam) is then used to deposit a 200 nm thick Ni layer (the metal layer) onto the oxide surface in an electrode pattern.

A 10 nm layer of amorphous carbon is then deposited on the surface of the device (over the metal/oxide layers or metal/passivation layers) via filament carbon coater to complete a graphene device precursor (carbon/metal/insulator).

The graphene device precursor is loaded into a tube furnace along with boats of Ti chips. The tube furnace is pumped down to ~3.5E-2Torr and then backfilled with forming gas (95% Ar/5% $H_2$) to achieve ~50 mT. The temperature of the tube furnace is run up to 800° C. for one hour and then allowed to cool naturally.

Example 2

Raman spectra obtained from a graphene device made according to Example 1 are shown in FIGS. 1 (taken 3 μm from a Ni edge), 2 (taken 50 μm from a Ni edge), and 3 (taken 100 μm from a Ni edge).

Example 3

Figure 4:
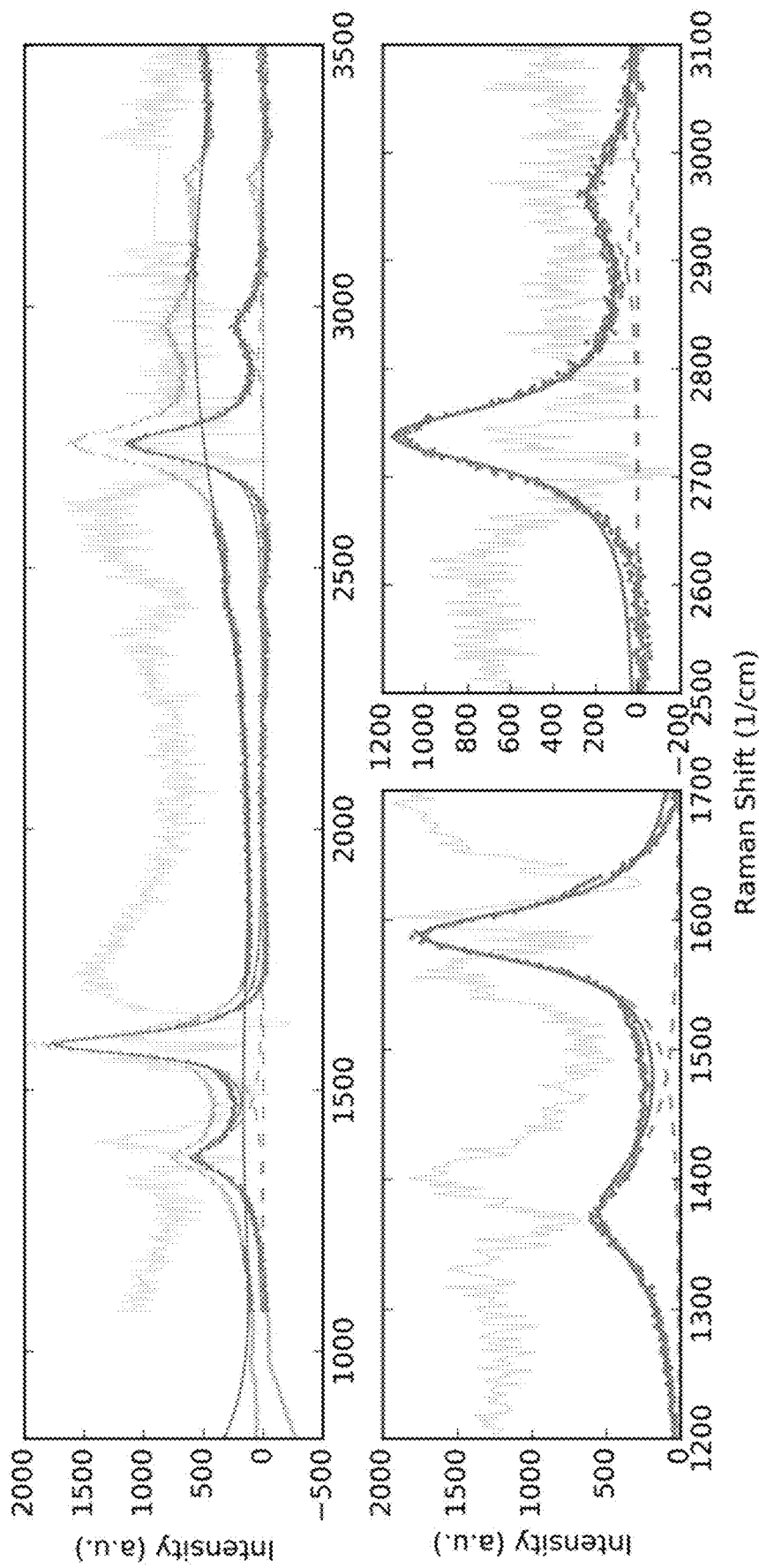
FIG. 4 shows the Raman spectra from a device that had been heated to 600° C. The spectra were taken 5 μm from a Ni edge.
Figure 5:
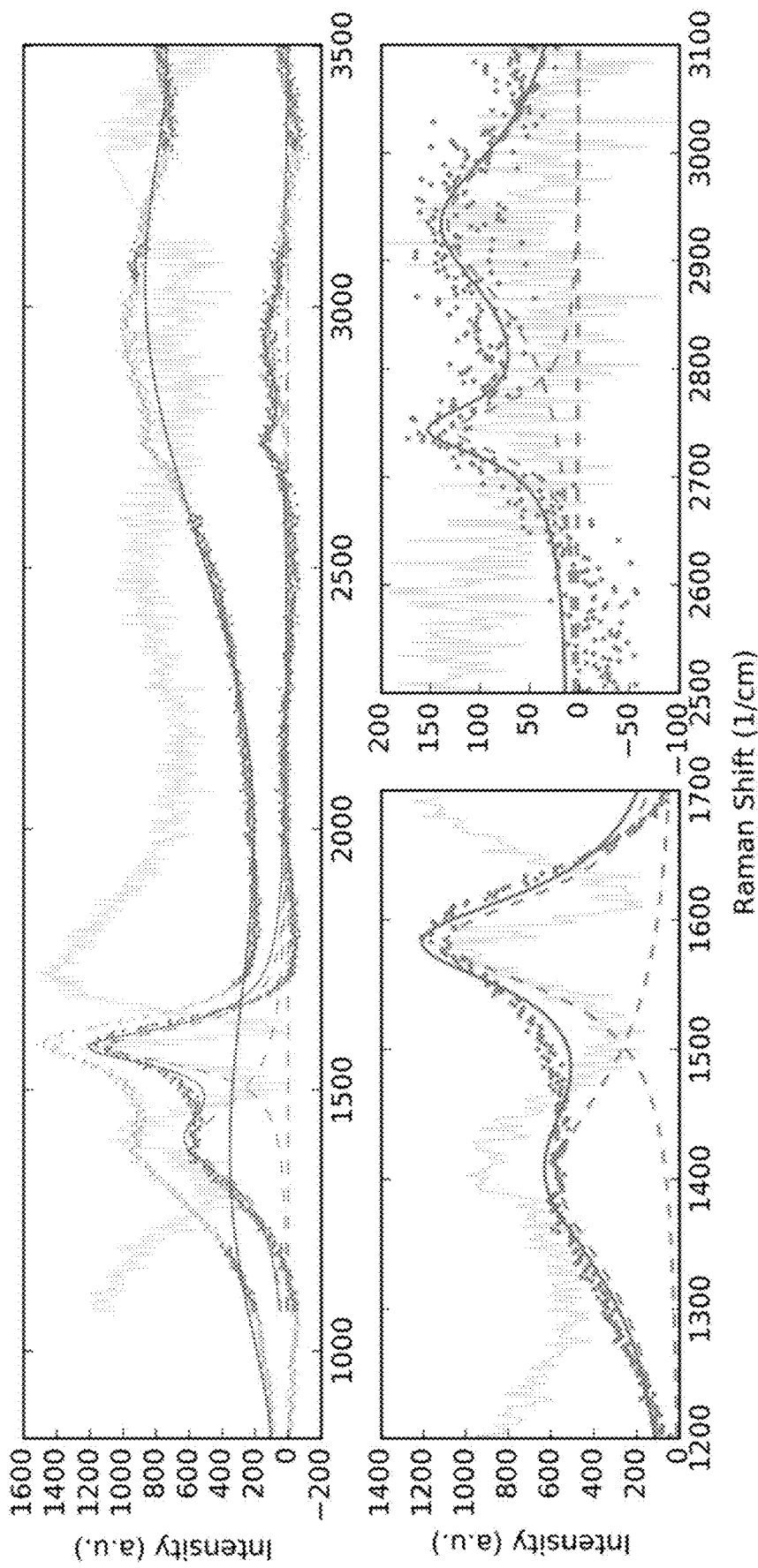
FIG. 5 shows the Raman spectra from a device that had been heated to 600° C. The spectra were taken 10 μm from a Ni edge.

Raman spectra obtained from a graphene device made according to Example 1, except that it was heated to 600° C. are shown in FIGS. 4 (taken 5 μm from a Ni edge) and 5 (taken 10 μm from a Ni edge).

Example 4

Figure 6:
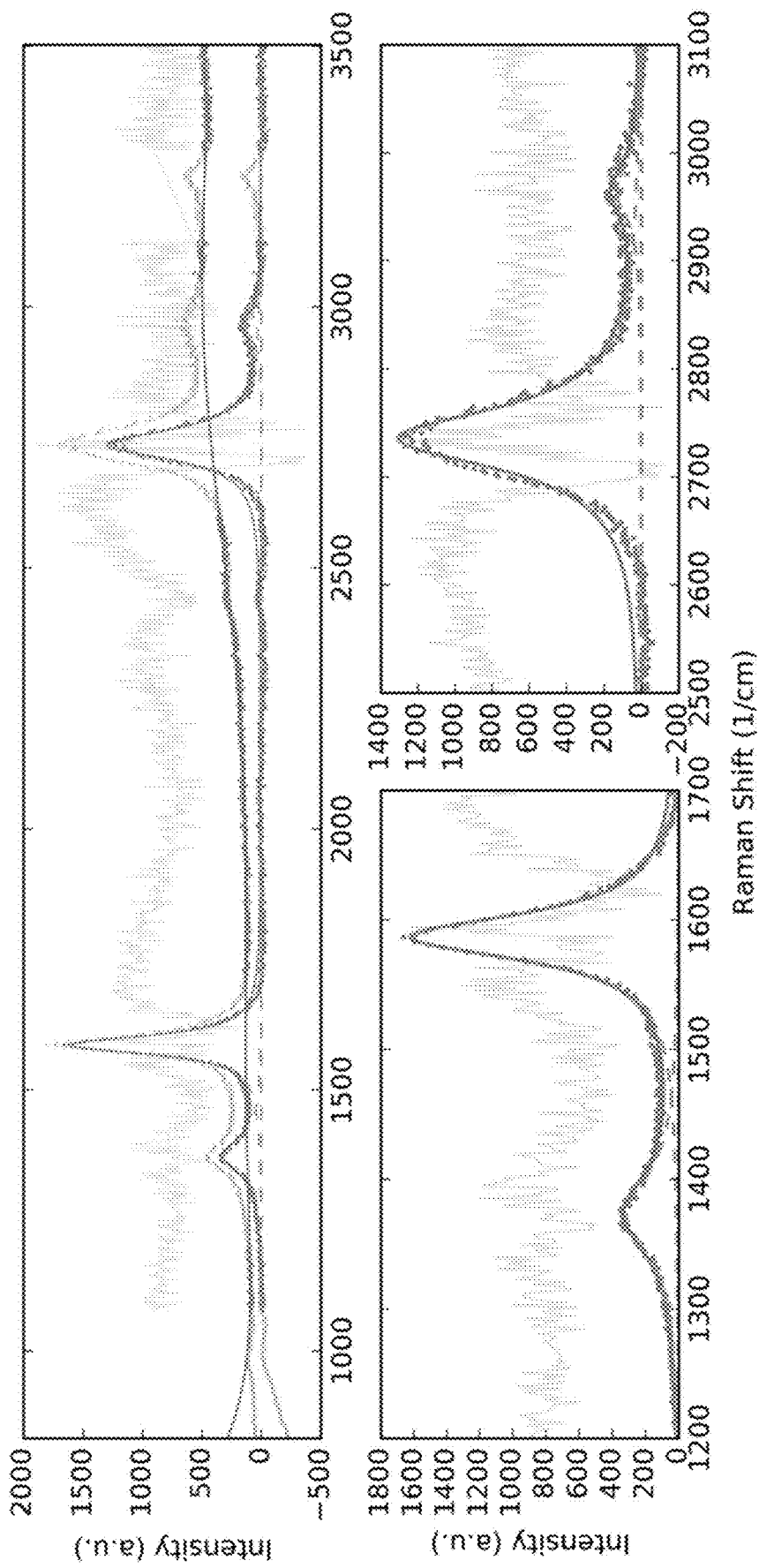
FIG. 6 shows the Raman spectra from a device that had been heated to 700° C. The spectra were taken at a Ni edge.
Figure 7:
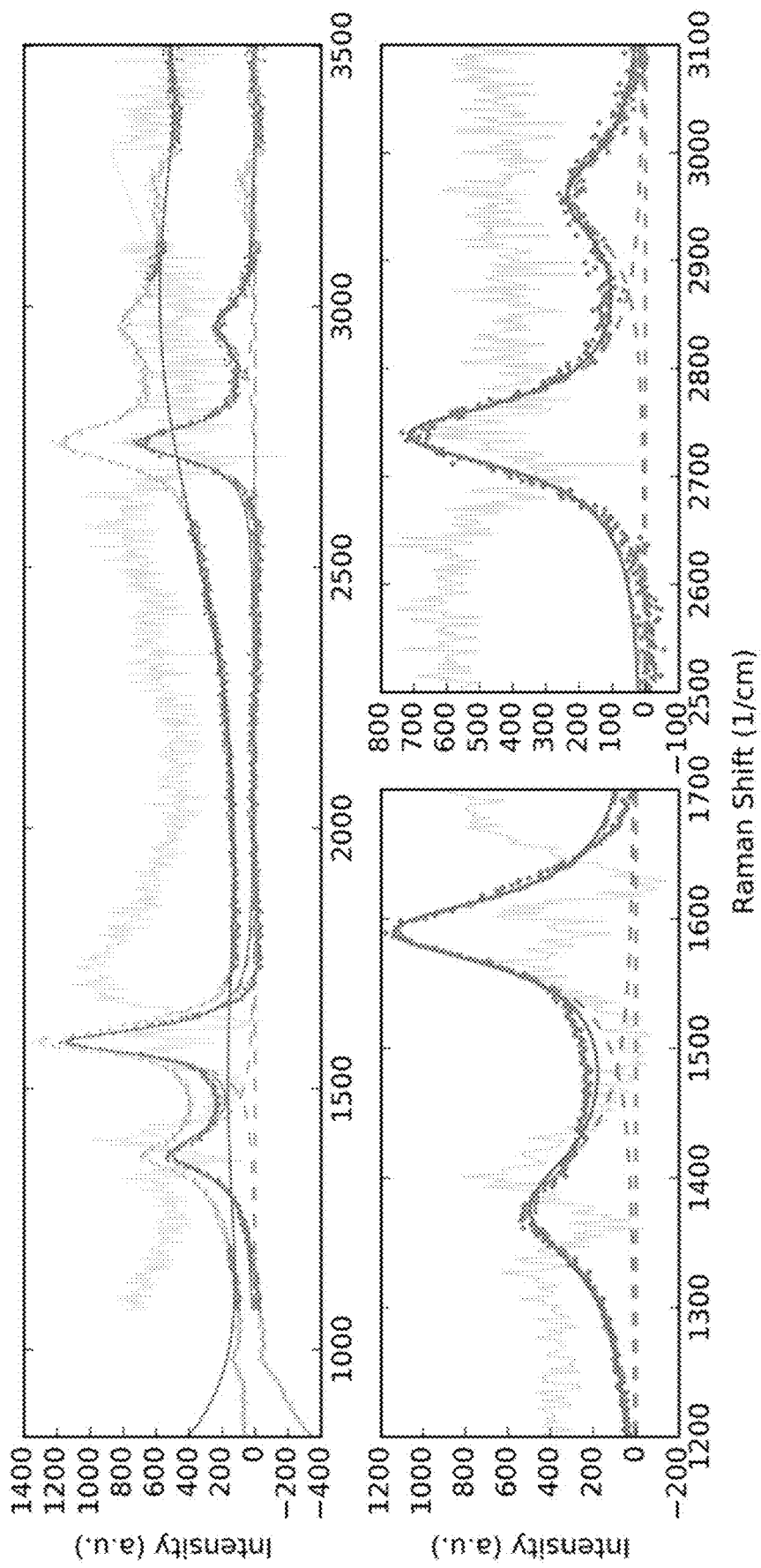
FIG. 7 shows the Raman spectra from a device that had been heated to 700° C. The spectra were taken 50 μm from a Ni edge.
Figure 8:
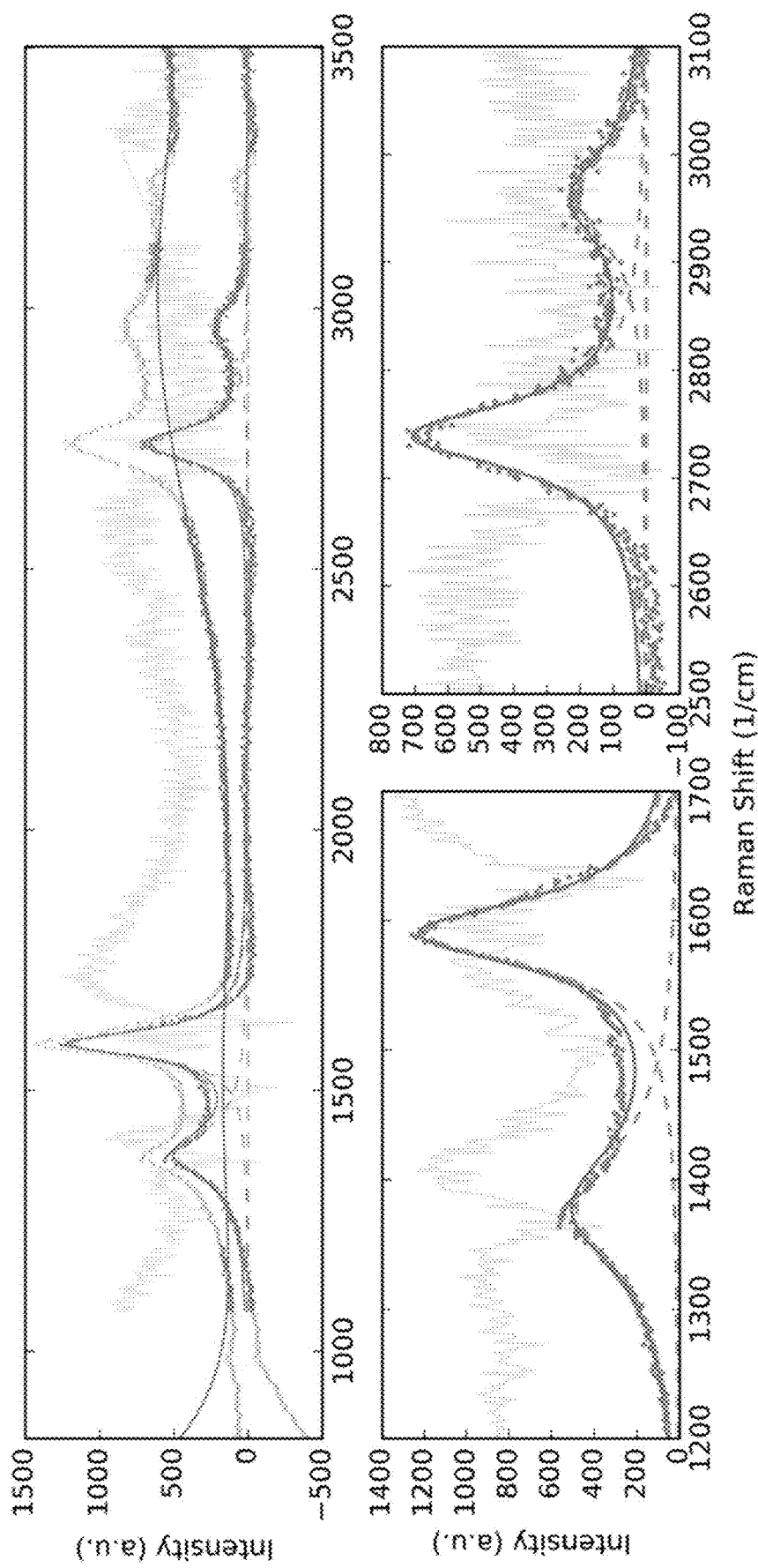
FIG. 8 shows the Raman spectra from a device that had been heated to 700° C. The spectra were taken 100 μm from a Ni edge.
Figure 9:
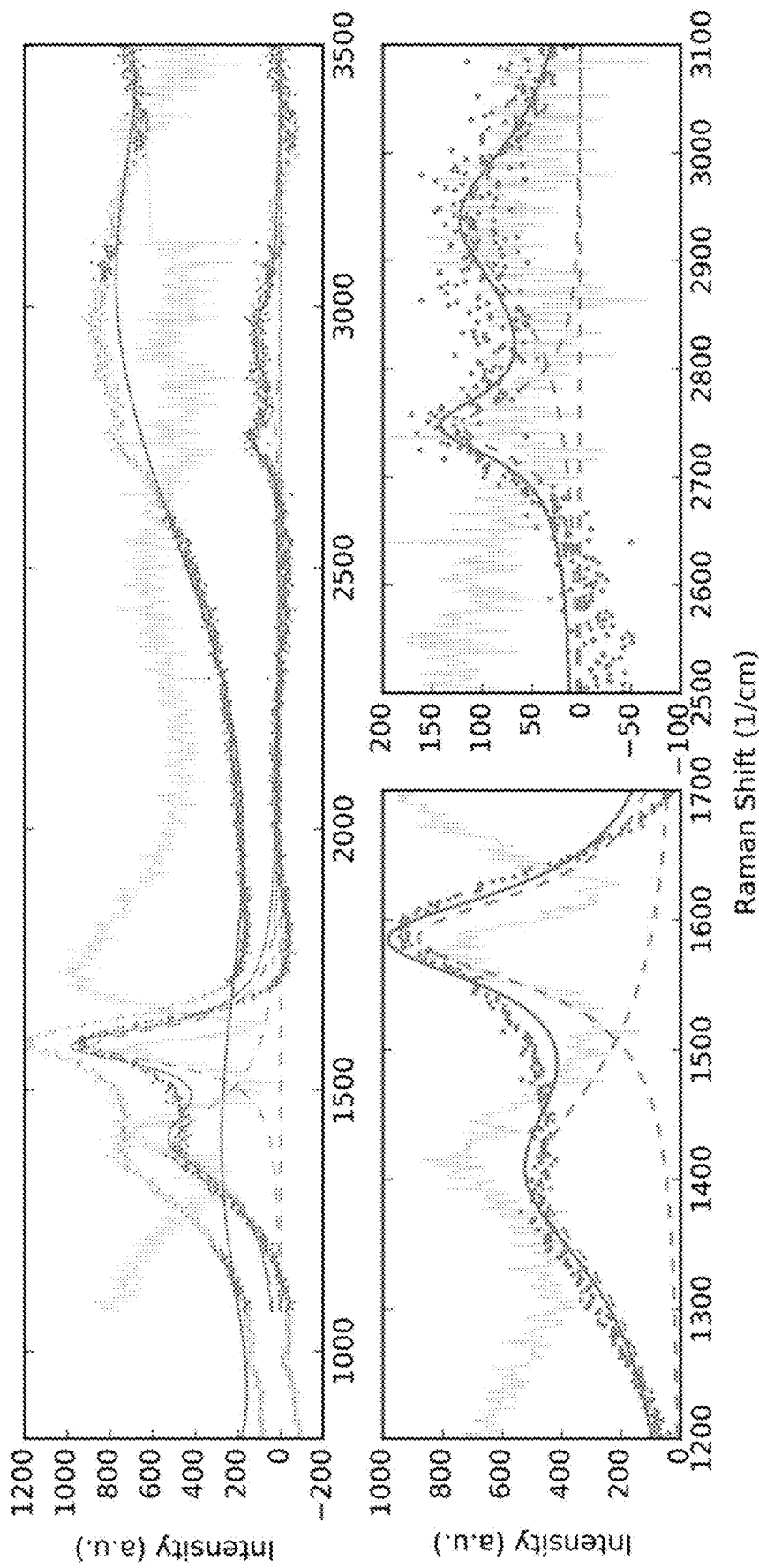
FIG. 9 shows the Raman spectra from a device that had been heated to 700° C. The spectra were taken 200 μm from a Ni edge.

Raman spectra obtained from a graphene device made according to Example 1, except that it was heated to 700° C. are shown in FIGS. 6 (taken at a Ni edge), 7 (taken 50 μm from a Ni edge), 8 (taken 100 μm from a Ni edge), and 9 (taken 200 μm from a Ni edge).

Example 5

A small sample of a 285 nm $SiO_2$/Si wafer is cleaved via a diamond scroll to be used as the insulating layer.

A 5 nm passivation layer of $Al_2O_3$ is deposited via atomic layer deposition onto the $SiO_2$ (the top of the insulator layer).

The oxide surface ($Al_2O_3$) is then cleaned with piranha (3:1 $H_2SO_4/H_2O_2$). The surface is further cleaned by reactive ion etching the surface in $O_2$ prior to metallization to remove any remaining organic substances.

An E-Beam is used to deposit a 5 nm layer of Cr (the metal adhesive layer) in an interdigital electrode pattern.

The E-Beam is then used to deposit a 200 nm thick Ni layer (the metal layer) on the Cr interdigital electrode pattern.

A 10 nm layer of amorphous carbon is then deposited on the surface of the device via a filament carbon coater. Alternatively, the carbon may be sputtered onto the device.

The graphene device precursor (e.g., carbon/metal/adhesive/passivation/insulator) is loaded into a tube furnace along with boats of Ti chips. The tube furnace is pumped down to ~3.5E-2Torr and then backfilled with forming gas (95% Ar/5% $H_2$) to achieve ~50 mT. The temperature of the tube furnace is run up to 800° C. for one hour and then allowed to cool naturally.

Numerous modifications and variations of the present invention are possible in light of the above teachings. It is therefore to be understood that within the scope of the appended claims, the invention may be practiced otherwise that as specifically described herein.

The invention claimed is:

1. A graphene device, comprising: a precursor graphene device and a graphene layer,
    wherein the precursor graphene device comprises: an insulator layer, wherein at least the top portion of the insulator layer is an electrical insulator; a metal layer in contact with and covering part of the top of the insulator layer; and a carbon layer in contact with the metal layer and on top of the insulator layer,
    further wherein the graphene layer is in contact with the metal layer and the top of the insulator layer.

2. The graphene device of claim 1, further comprising a passivation layer located between the insulator layer and the metal/carbon layers and in contact with and covering a substantial portion of the top of the insulator layer.

3. The graphene device of claim 1, further comprising a metal adhesive layer located between the metal layer and either the insulator layer or passivation layer.

4. The graphene device of claim 2, further comprising a metal adhesive layer located between the metal layer and either the insulator layer or passivation layer.

5. The graphene device of claim 1, wherein the graphene layer is formed by loading the precursor graphene device into a tube furnace along with boats and oxygen free forming gas; heating the tube furnace to a temperature sufficient to initiate graphene formation; and cooling the precursor graphene device.

6. The graphene device of claim 1, wherein the graphene layer is formed by loading the precursor graphene device into a tube furnace along with boats and oxygen free forming gas; heating the tube furnace to a temperature sufficient to initiate graphene formation; cooling the precursor graphene device; and cleaning the insulator layer to remove organic substances by reactive ion etching.

7. The graphene device precursor of claim 1, wherein the insulator layer is a thermal oxide layer.

8. The graphene device precursor of claim 1, wherein the metal is selected from Co, Ni, Re, Pd and Pt.

9. The graphene device precursor of claim 1, wherein the thickness of the metal layer is from 10-200 nm.

10. The graphene device precursor of claim 1, wherein the metal layer is selected from Ti and Cr; and the thickness is from 1-10 nm.

11. The graphene device precursor of claim 1, wherein the thickness of the carbon layer is from 0.3-50 nm.

12. The graphene device precursor of claim 2, wherein the passivation layer is selected from Al2O3, $HfO_2$, $Ta_2O_5$, ZnO, $TiO_2$ and $SiO_2$.

* * * * *